United States Patent
Onishi et al.

(10) Patent No.: US 9,093,953 B2
(45) Date of Patent: Jul. 28, 2015

(54) OSCILLATOR

(75) Inventors: Yasuharu Onishi, Kanagawa (JP); Jun Kuroda, Kanagawa (JP); Yuichiro Kishinami, Kanagawa (JP); Shigeo Satou, Kanagawa (JP); Yukio Murata, Kanagawa (JP); Nobuhiro Kawashima, Kanagawa (JP); Tatsuya Uchikawa, Kanagawa (JP); Motoyoshi Komoda, Kanagawa (JP)

(73) Assignee: NEC CASIO MOBILE COMMUNICATIONS, LTD., Kanagawa (JP)

( * ) Notice: Subject to any disclaimer, the term of this patent is extended or adjusted under 35 U.S.C. 154(b) by 0 days.

(21) Appl. No.: 14/008,448

(22) PCT Filed: Mar. 8, 2012

(86) PCT No.: PCT/JP2012/001605
§ 371 (c)(1),
(2), (4) Date: Sep. 27, 2013

(87) PCT Pub. No.: WO2012/132262
PCT Pub. Date: Oct. 4, 2012

(65) Prior Publication Data
US 2014/0022026 A1 Jan. 23, 2014

(30) Foreign Application Priority Data

Mar. 31, 2011 (JP) .................... 2011-081036

(51) Int. Cl.
*H03B 28/00* (2006.01)
*H04R 17/00* (2006.01)
B06B 1/06 (2006.01)
*G10K 9/122* (2006.01)

(52) U.S. Cl.
CPC *H03B 28/00* (2013.01); *B06B 1/06* (2013.01); *G10K 9/122* (2013.01); *H04R 17/00* (2013.01); *H04R 2217/03* (2013.01); *H04R 2499/11* (2013.01)

(58) Field of Classification Search
CPC ....................................... H03B 28/00
USPC ............... 310/313 R, 348; 331/107 R, 116 R, 331/116 M, 154
See application file for complete search history.

(56) References Cited

U.S. PATENT DOCUMENTS

2005/0023937 A1* 2/2005 Sashida et al. ............. 310/348
2007/0177747 A1 8/2007 Onishi et al.
(Continued)

FOREIGN PATENT DOCUMENTS

JP 61-111298 U 7/1986
JP 61-252798 A 11/1986
(Continued)

OTHER PUBLICATIONS

International Search Report for PCT/JP2012/001605 dated Apr. 10, 2012.
(Continued)

*Primary Examiner* — Joseph Chang
*Assistant Examiner* — Jeffrey Shin
(74) *Attorney, Agent, or Firm* — Sughrue Mion, PLLC (57) ABSTRACT

Provided is an oscillator including a piezoelectric vibrator (10), a vibration member (20) that constrains the piezoelectric vibrator (10) on one surface thereof, an elastic member (40) that is provided on one surface of the vibration member (20) or the other surface opposite to one surface and provided so as to be located between edges of the piezoelectric vibrator (10) and the vibration member (20) when seen in a plan view, a fixing member (42) that is provided on one surface or the other surface of the vibration member (20) and provided so as to be located between the piezoelectric vibrator (10) and the elastic member (40) when seen in a plan view, and a supporting member (30) that supports the vibration member (20) through the elastic member (40) and the fixing member (42).

6 Claims, 5 Drawing Sheets

(56) References Cited

U.S. PATENT DOCUMENTS

| | | | |
|---|---|---|---|
| 2009/0045700 A1* | 2/2009 | Sasaki et al. | 310/348 |
| 2011/0163635 A1* | 7/2011 | Kim et al. | 310/328 |

FOREIGN PATENT DOCUMENTS

| | | | |
|---|---|---|---|
| JP | 11-024668 A | 1/1999 | |
| JP | 2000140759 A | 5/2000 | |
| JP | 2007-251271 A | 9/2007 | |
| WO | 2007/083497 A1 | 7/2007 | |

OTHER PUBLICATIONS

Communication dated Aug. 14, 2014 from the European Patent Office in counterpart application No. 12765550.4.

* cited by examiner

OSCILLATOR

CROSS REFERENCE TO RELATED APPLICATIONS

This is a National Stage of International Application No. PCT/JP2012/001605, filed Mar. 8, 2012, claiming priority from Japanese Patent Application No. 2011-081036, filed Mar. 31, 2011, the contents of all of which are incorporated herein by reference in their entirety.

TECHNICAL FIELD

The present invention relates to an oscillator having a piezoelectric vibrator.

BACKGROUND ART

As an electro-acoustic transducer used in an electronic device, there is a piezoelectric electro-acoustic transducer using a piezoelectric vibrator. The piezoelectric electro-acoustic transducer generates a vibrational amplitude by using an expansion and contraction motion of the piezoelectric vibrator. Thus, there is an advantage in a reduction in the thickness thereof as compared with an electrodynamic electro-acoustic transducer constituted by a magnet, a voice coil, or the like. A technique involved in the piezoelectric electro-acoustic transducer is disclosed in, for example, Patent Document 1. In the technique disclosed in Patent Document 1, a base to which a piezoelectric element is attached is connected to a supporting member through a vibrating film having a lower rigidity than the base.

In addition, the piezoelectric vibrator is also used as, for example, an ultrasound wave sensor. A technique disclosed in Patent Document 2 relates to the ultrasound wave sensor using the piezoelectric vibrator, and discloses that an outer circumferential edge of a metal plate that vibrates flexurally in association with an expansion and contraction vibration of a piezoelectric member is held by a holding member.

RELATED DOCUMENT

Patent Document

[Patent Document 1] Pamphlet of International Publication WO. 2007/083497

[Patent Document 2] Japanese Unexamined Patent Publication No. 2007-251271

DISCLOSURE OF THE INVENTION

In an oscillator using a piezoelectric vibrator, it is required to improve a sound pressure level thereof.

According to the invention, provided is an oscillator comprising: a piezoelectric vibrator; a vibration member that constrains the piezoelectric vibrator on one surface thereof; an elastic member that is provided on one surface of the vibration member or the other surface opposite to one surface and provided so as to be located between the piezoelectric vibrator and an edge of the vibration member when seen in a plan view; a fixing member that is provided on one surface or the other surface of the vibration member and provided so as to be located between the piezoelectric vibrator and the elastic member when seen in a plan view; and a supporting member that supports the vibration member through the elastic member and the fixing member.

According to the invention, in an oscillator using a piezoelectric vibrator, it is possible to improve a sound pressure level thereof.

BRIEF DESCRIPTION OF THE DRAWINGS

The above-mentioned objects, other objects, features and advantages will be made clearer from preferred embodiments described below, and the following accompanying drawings.

DESCRIPTION OF EMBODIMENTS

Hereinafter, embodiments of the invention will be described with reference to the accompanying drawings. In all the drawings, like elements are referenced by like reference numerals and descriptions thereof will not be repeated.

Figure 1:
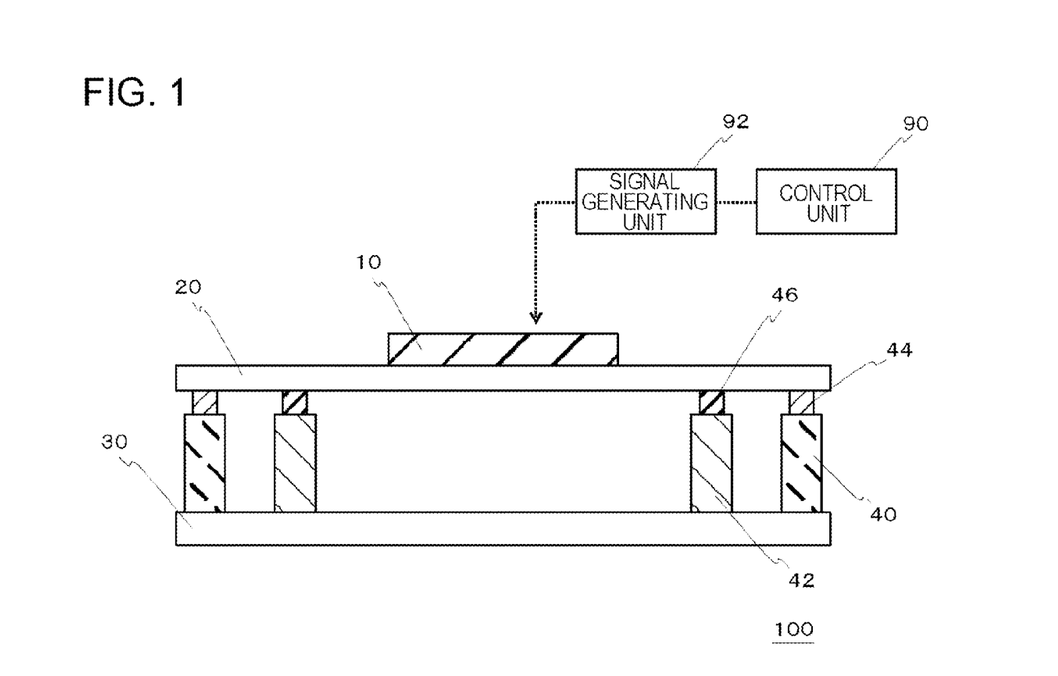
FIG. 1 is a cross-sectional view illustrating an oscillator according to a first embodiment.

FIG. 1 is a cross-sectional view illustrating an oscillator 100 according to a first embodiment. The oscillator 100 comprises a piezoelectric vibrator 10, a vibration member 20, an elastic member 40, a fixing member 42, and a supporting member 30. For example, the oscillator 100 is installed in a portable terminal device such as a cellular phone.

The vibration member 20 constrains the piezoelectric vibrator 10 on one surface thereof. The elastic member 40 is provided on the other surface opposite to one surface of the vibration member 20 and provided so as to be located between the piezoelectric vibrator 10 and the edge of the vibration member 20 when seen in a plan view. The fixing member 42 is provided on the other surface of the vibration member 20 and provided so as to be located between the piezoelectric vibrator 10 and the elastic member 40 when seen in a plan view. The supporting member 30 supports the vibration member 20 through the elastic member 40 and the fixing member 42. Hereinafter, the configuration of the oscillator 100 will be described in detail.

The vibration member 20 has, for example, a flat plate shape. The vibration member 20 is constituted by a metal material, for example, a versatile material such as phosphor bronze or stainless steel. The thickness of the vibration member 20 is preferably 5 µm to 500 µm. In addition, a modulus of longitudinal elasticity of the vibration member 20 is preferably 1 GPa to 500 GPa. When the modulus of longitudinal elasticity of the vibration member 20 is excessively low or high, there is a concern that vibration characteristics and reliability of the oscillator may be damaged.

The elastic member 40 is constituted by a resin material such as an olefin-based polymer material, for example, polyethylene terephthalate or urethane. For example, a plurality of the elastic members 40 are provided around the piezoelectric vibrator 10 so as to be separated from each other, but the invention is not limited thereto. In other words, the elastic members 40 may be provided as one body so as to surround the entire circumference of the piezoelectric vibrator 10, or only one elastic member may be provided in a portion of the perimeter of the elastic member 40.

In addition, in the embodiment, the elastic member 40 is provided so as to be bonded to the other surface of the vibration member 20, but may be provided so as to be bonded to, for example, one surface of the vibration member 20.

The fixing member 42 is constituted by a metal material, for example, brass, stainless steel, or copper. The fixing member 42 has a higher elastic modulus than the elastic member 40.

For example, the fixing member 42 is located on a straight line connecting the elastic member 40 and the center point of the piezoelectric vibrator 10. Thus, in a vibration mode of the embodiment, which will be described later, it is possible to effectively increase a vibrational amplitude of the vibration member 20.

In a similar manner as the elastic member 40, for example, a plurality of the fixing members 42 are provided around the piezoelectric vibrator 10 so as to be separated from each other, but the invention is not limited thereto. In addition, in the embodiment, the fixing member 42 is provided so as to be bonded to the other surface of the vibration member 20, but may be provided so as to be bonded to, for example, one surface of the vibration member 20.

As illustrated in FIG. 1, the fixing members 42 are bonded to the vibration member 20 through, for example, a connection member 46. The connection member 46 may be constituted by, for example, a metal material. The connection member 46 may be constituted by an elastic material, for example, natural rubber, NBR rubber, or silicon rubber. In this case, since constraint force from the fixing member 42 with respect to the vibration member 20 is mitigated, it is possible to increase the vibrational amplitude in the vibration mode of the embodiment which will be described later.

In a plane direction horizontal to one surface of the vibration member 20, the cross section of the connection member 46 is smaller than that of the fixing member 42. Even in this case, since constraint force from the fixing member 42 with respect to the vibration member 20 is mitigated, it is possible to increase the vibrational amplitude in the vibration mode of the embodiment which will be described later.

As illustrated in FIG. 1, the elastic member 40 is bonded to the vibration member 20 through, for example, a connection member 44. The connection member 44 is constituted by, for example, a metal material.

As illustrated in FIG. 1, the supporting member 30 is disposed on the other surface side of the vibration member 20. The supporting member 30 disposed on the other surface side of the vibration member 20 is bonded to the elastic members 40 and the fixing members 42 that are provided on the other surface of the vibration member 20. Thus, the supporting member 30 supports the vibration member 20.

In addition, for example, when the elastic member 40 and the fixing member 42 are provided on different surfaces of the vibration member 20, the supporting member 30 is disposed on one surface side and the other surface side of the vibration member 20 (not shown).

Figure 2:
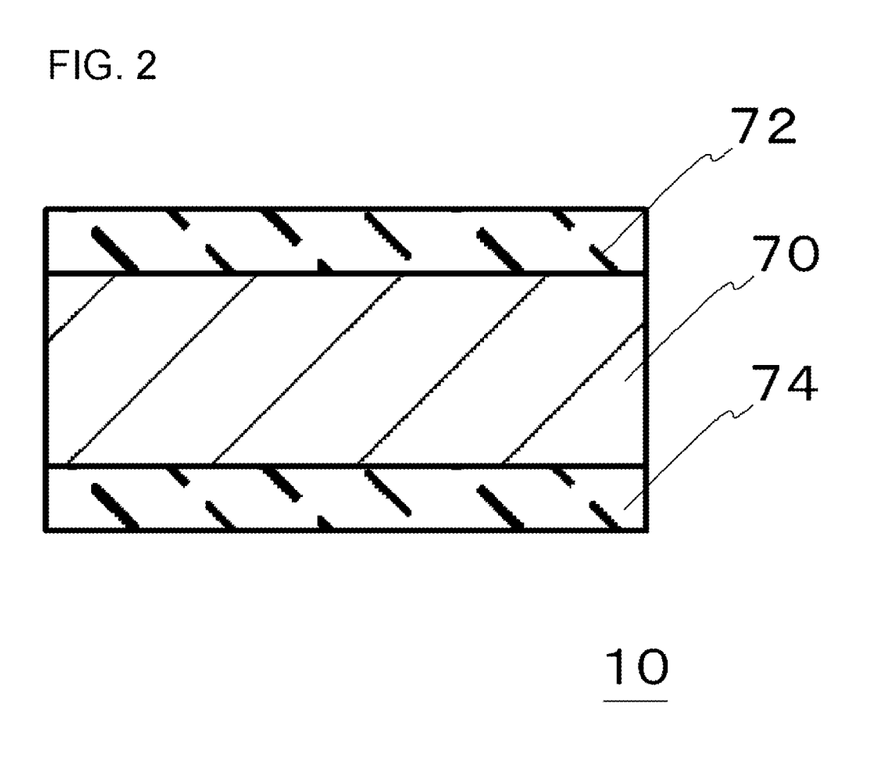
FIG. 2 is a cross-sectional view illustrating a piezoelectric vibrator shown in FIG. 1.

FIG. 2 is a cross-sectional view illustrating the piezoelectric vibrator 10 shown in FIG. 1. As illustrated in FIG. 2, the piezoelectric vibrator 10 has a piezoelectric body 70, an upper electrode 72, and a lower electrode 74. The piezoelectric body 70 is interposed between the upper electrode 72 and the lower electrode 74. In addition, the piezoelectric body 70 is polarized in the thickness direction thereof (vertical direction of FIG. 2). The piezoelectric vibrator 10 is, for example, circular or elliptical in a plane direction horizontal to one surface of the vibration member 20.

The piezoelectric body 70 is constituted by a material having a piezoelectric effect, and is constituted by, for example, lead zirconate titanate (PZT) or barium titanate (BaTiO3) as a material having a high electro-mechanical conversion efficiency. In addition, the thickness of the piezoelectric body 70 is preferably 10 µm to 1 mm. When the thickness is less than 10 µm, there is a concern that the piezoelectric body may be damaged during handling because the piezoelectric body 70 is constituted by a brittle material. On the other hand, when the thickness exceeds 1 mm, the electric field intensity of the piezoelectric body 70 decreases, which results in a decrease in the energy conversion efficiency.

The upper electrode 72 and the lower electrode 74 are constituted by a material having an electrical conduction property, for example, silver or a silver/palladium alloy. Since silver is a low-resistance versatile material, there is an advantage from the viewpoint of a manufacturing cost and a manufacturing process. In addition, a silver/palladium alloy is a low-resistance material having an excellent oxidation resistance and has an excellent reliability. The thicknesses of the upper electrode 72 and the lower electrode 74 are preferably 1 µm to 50 µm. When the thicknesses are less than 1 µm, it is difficult to uniformly mold the upper electrode 72 and the lower electrode 74. On the other hand, when the thicknesses exceed 50 µm, the upper electrode 72 or the lower electrode 74 serves as a constraint surface with respect to the piezoelectric body 70, which results in a decrease in the energy conversion efficiency.

The oscillator 100 includes a control unit 90 and a signal generating unit 92. The signal generating unit 92 is connected to the piezoelectric vibrator 10 and generates an electrical signal to be input to the piezoelectric vibrator 10. The control unit 90 is connected to the signal generating unit 92 and controls the generation of a signal by the signal generating unit 92. The control unit 90 controls the generation of the signal by the signal generating unit 92 based on information that is input from the outside, thereby allowing the output of the oscillator 100 to be controlled.

When the oscillator 100 is used as a parametric speaker, the control unit 90 inputs a modulated signal of the parametric speaker through the signal generating unit 92. In this case, the piezoelectric vibrator 10 uses a sound wave of equal to or more than 20 kHz, for example, 100 kHz, as a carrier wave of the signal.

In addition, when the oscillator 100 is used as a general speaker, the control unit 90 may directly input a sound signal to the piezoelectric vibrator 10 through the signal generating unit 92.

In addition, when the oscillator 100 is used as a sound wave sensor, a signal to be input to the control unit 90 is a command signal to the effect that the sound wave is oscillated. When the oscillator 100 is used as the sound wave sensor, the signal generating unit 92 causes the piezoelectric vibrator 10 to generate a sound wave having a resonance frequency of the piezoelectric vibrator 10.

An operational principle of the parametric speaker is as follows. The parametric speaker performs sound reproduction using a principle in which ultrasound waves on which an AM modulation, a DSB modulation, an SSB modulation, or an FM modulation is performed are emitted into the air and an audible sound is issued based on the non-linear characteristics when ultrasonic waves are propagated into the air. The term "non-linear" herein indicates a transition from a laminar flow to a turbulent flow when the Reynolds number expressed by the ratio of the inertial action and the viscous action of a flow increases. In other words, since the sound wave is very slightly disturbed within a fluid, the sound wave is propagated non-linearly. In particular, when the ultrasound waves are emitted into the air, higher harmonic waves associated with the non-linearity are conspicuously generated. In addition, the sound wave is in a sparse and dense state in which molecular assemblies in the air are mixed lightly and shadily. When it takes time for air molecules to be restored rather than compressed, the air which is not capable of being restored after the compression collides with air molecules continuously propagated, and thus a shock wave occurs. The audible sound is generated by this shock wave. Since the parametric speaker can form a sound field only in the vicinity of a user, and the parametric speaker is excellent from the viewpoint of privacy protection.

Figure 3:
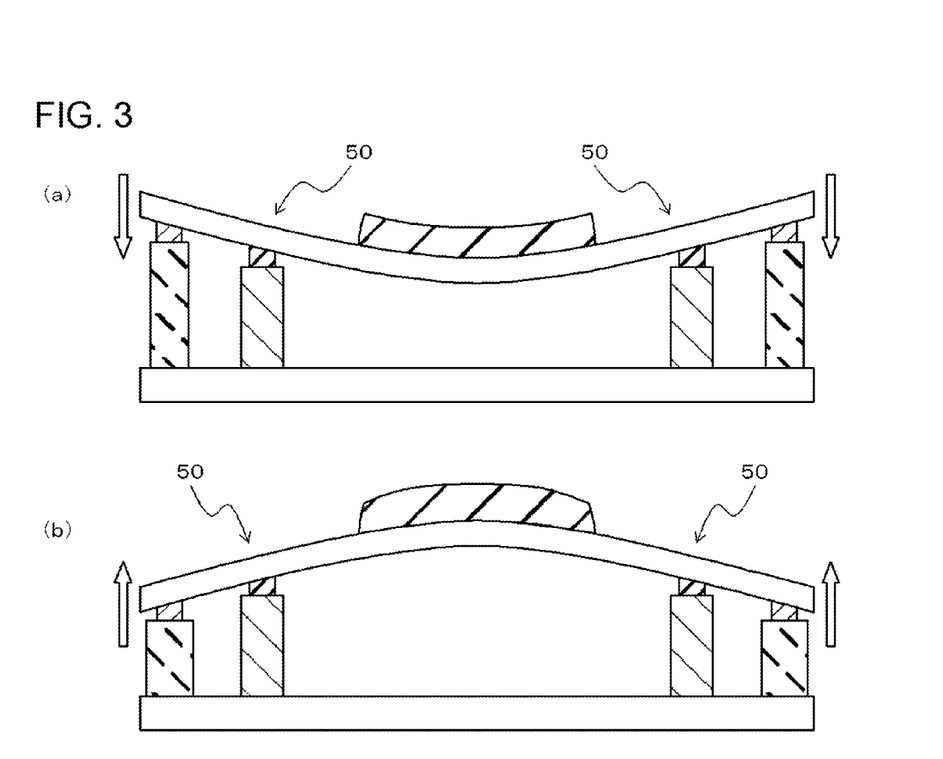
FIG. 3 is a cross-sectional view illustrating a vibration mode of the oscillator shown in FIG. 1.

Next, a principle in which the amplitude of the vibration member 20 increases in the embodiment will be described. FIG. 3 is a cross-sectional view illustrating a vibration mode of the oscillator 100 shown in FIG. 1. The vibration member 20 vibrates in a vertical direction of FIG. 3 in association with an expansion and contraction vibration of the piezoelectric vibrator 10. At this time, the vibration member 20 vibrates using the fixing member 42 as a supporting point 50.

In the embodiment, the elastic member 40 is provided at a position closer to the edge of the vibration member 20 than the fixing member 42. For this reason, when the vibration member 20 vibrates, stress from the elastic member 40 is applied to the end of the vibration member 20 in the directions shown by block arrows of FIG. 3.

In other words, as illustrated in FIG. 3(a), when the vibration member 20 vibrates in a convex manner downward in the drawing, a portion closer to the edge of the vibration member 20 than the supporting point 50 is displaced upward in the drawing. At this time, downward stress in the drawing, that is, stress in a direction in which the vibration of the vibration member 20 increases is applied to the end of the vibration member 20 from the elastic member 40.

In addition, as illustrated in FIG. 3(b), when the vibration member 20 vibrates in a convex manner upward in the drawing, a portion closer to the edge of the vibration member 20 than the supporting point 50 is displaced downward in the drawing. At this time, upward stress in the drawing, that is, stress in a direction in which the vibration of the vibration member 20 increases is applied to the end of the vibration member 20 from the elastic member 40.

In this manner, the amplitude of the vibration member 20 increases.

Next, effects of the embodiment will be described. The oscillator 100 according to the embodiment comprises the elastic member 40 that is provided on the other surface of the vibration member 20 and provided so as to be located between the piezoelectric vibrator 10 and the edge of the vibration member 20 when seen in a plan view, and the fixing member 42 that is provided on the other surface of the piezoelectric vibrator 10 and provided so as to be located between the piezoelectric vibrator 10 and the elastic member 40 when seen in a plan view. The vibration member 20 is supported by the supporting member 30 through the elastic members 40 and the fixing members 42.

With such a configuration, when the vibration member 20 vibrates, the vibration member 20 receives stress in the vertical direction from the elastic member 40 by using the fixing member 42 as a supporting point. Thus, the amplitude of the vibration member 20 increases. Therefore, in the oscillator using the piezoelectric vibrator, it is possible to improve a sound pressure level thereof.

Figure 4:
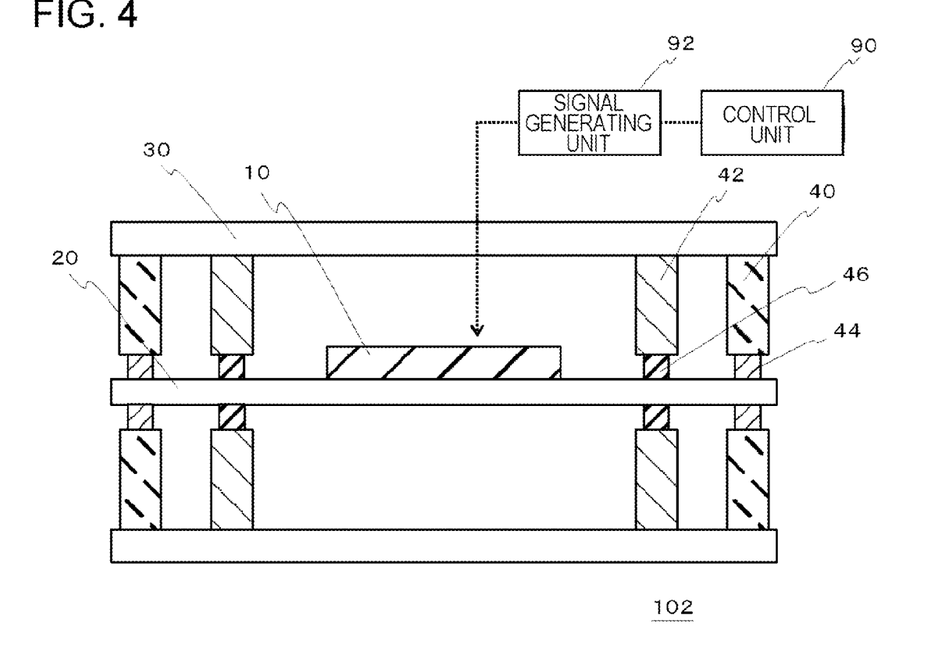
FIG. 4 is a cross-sectional view illustrating an oscillator according to a second embodiment.

FIG. 4 is a cross-sectional view illustrating an oscillator 102 according to a second embodiment, and corresponds to FIG. 1 according to the first embodiment. The oscillator 102 according to the embodiment has the same configuration as the oscillator 100 according to the first embodiment except that the elastic members 40 and the fixing members 42 are provided on one surface and the other surface of the vibration member 20.

As illustrated in FIG. 4, the elastic members 40 are bonded to the vibration member 20 through the connection member 44 on one surface and the other surface of the vibration member 20. The elastic member 40 provided on one surface of the vibration member 20 and the elastic member 40 provided on the other surface thereof are located so as to overlap each other when seen in a plan view.

The fixing members 42 are bonded to the vibration member 20 through the connection member 46 on one surface and the other surface of the vibration member 20. The fixing member 42 provided on one surface of the vibration member 20 and the fixing member 42 provided on the other surface of the vibration member 20 are located so as to overlap each other when seen in a plan view.

The supporting members 30 are disposed on one surface side and the other surface side of the vibration member 20. The supporting members 30 support the vibration member 20 through the elastic members 40 and the fixing members 42 that are provided on one surface and the other surface of the vibration member 20.

Even in the embodiment, it is possible to obtain the same effects as the first embodiment.

In addition, the elastic members 40 are provided on one surface and the other surface of the vibration member 20.

For this reason, when the vibration member 20 vibrates, stress applied from the elastic members 40 to the vibration member 20 increases as compared with the first embodiment. Thus, it is possible to further increase the amplitude of the vibration member.

Figure 5:
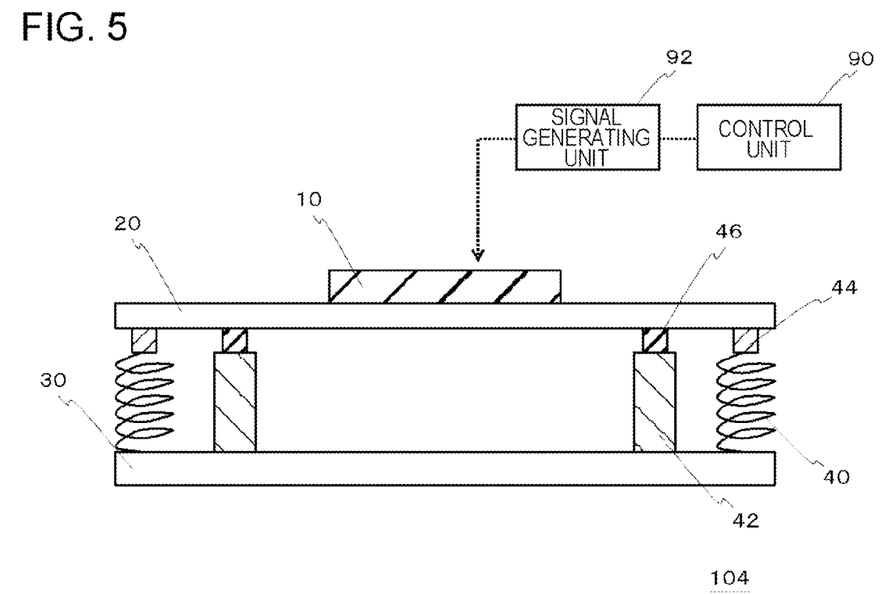
FIG. 5 is a cross-sectional view illustrating an oscillator according to a third embodiment.

FIG. 5 is a cross-sectional view illustrating an oscillator 104 according to a third embodiment, and corresponds to FIG. 1 according to the first embodiment. The oscillator 104 according to the embodiment has the same configuration as the oscillator 100 according to the first embodiment except that the elastic member 40 is constituted by a spring.

Even in the embodiment, it is possible to obtain the same effects as the first embodiment.

As described above, although the embodiments of the invention have been set forth with reference to the drawings, they are merely illustrative of the invention, and various configurations other than stated above can be adopted.

The application claims priority from Japanese Patent Application No. 2011-081036 filed on Mar. 31, 2011, the content of which is incorporated herein by reference in its entirety.

The invention claimed is:

1. An oscillator comprising:
   a piezoelectric vibrator;
   a vibration member that constrains the piezoelectric vibrator on one surface thereof;
   an elastic member that is provided on one surface of the vibration member or another surface, opposite the one surface, and provided so as to be located between the piezoelectric vibrator and an edge of the vibration member when seen in a plan view;
   a fixing member that is provided on one surface or the other surface of the vibration member and provided so as to be located between the piezoelectric vibrator and the elastic member when seen in a plan view; and
   a supporting member that supports the vibration member through the elastic member and the fixing member,
   wherein the elastic member and the fixing member are provided on a first region of the vibration member, another elastic member and another fixing member are provided on a second region of the vibration member, and the first and second regions oppose one another across the piezoelectric vibrator in the plan view.

2. The oscillator according to claim 1, wherein the elastic member is constituted by polyethylene terephthalate or urethane.

3. The oscillator according to claim 1, wherein the elastic member is a spring.

4. The oscillator according to claim 1,
wherein the elastic member and the another elastic member are respectively provided on the one surface and another surface, opposite the one surface, of the vibration member.

5. The oscillator according to claim 1,
wherein the fixing member is bonded to the vibration member through an elastic material.

6. An oscillator comprising:
a piezoelectric vibrator;
a vibration member that constrains the piezoelectric vibrator on one surface thereof;
a single elastic member, comprising one body including a first elastic portion and a second elastic portion, on one surface of the vibration member and on another surface, opposite the one surface, and the first elastic portion is provided so as to be located between the piezoelectric vibrator and an edge of the vibration member when seen in a plan view;

a fixing member that is provided on one surface or the other surface of the vibration member and provided so as to be located between the piezoelectric vibrator and the single elastic member when seen in a plan view; and a supporting member that supports the vibration member through the first elastic portion and the fixing member, wherein the first elastic portion and the fixing member are provided on a first region of the vibration member, the second elastic portion and another fixing member are provided on a second region of the vibration member, and the first and second regions oppose one another across the piezoelectric vibrator in the plan view.

\* \* \* \* \*